US009925557B2

(12) United States Patent
Sublemontier et al.

(10) Patent No.: US 9,925,557 B2
(45) Date of Patent: Mar. 27, 2018

(54) METHOD FOR THE SYNTHESIS OF A NANOSTRUCTURED COMPOSITE MATERIAL AND A DEVICE FOR IMPLEMENTING SAID METHOD

(71) Applicant: Commissariat A L'Energie Atomique Et Aux Energies Alternatives, Paris (FR)

(72) Inventors: Olivier Sublemontier, Fontenay Aux Roses (FR); Harold Kintz, Paris (FR); Yann Leconte, St Remy-les-Chevreuse (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 187 days.

(21) Appl. No.: 13/963,358

(22) Filed: Aug. 9, 2013

(65) Prior Publication Data

US 2014/0044886 A1 Feb. 13, 2014

(30) Foreign Application Priority Data

Aug. 10, 2012 (FR) ..................................... 12 57770

(51) Int. Cl.
*B05D 1/12* (2006.01)
*C23C 14/06* (2006.01)
(Continued)

(52) U.S. Cl.
CPC ................ *B05D 1/12* (2013.01); *C23C 14/06* (2013.01); *C23C 14/22* (2013.01); *C23C 14/228* (2013.01); *C23C 14/54* (2013.01); *B82Y 40/00* (2013.01)

(58) Field of Classification Search
CPC ......... B05D 1/12; C23C 14/54; C23C 14/228; C23C 14/22; C23C 14/06; B82Y 40/00
See application file for complete search history.

(56) References Cited

U.S. PATENT DOCUMENTS 5,561,326 A * 10/1996 Ito ........................ C23C 14/0641 257/751
5,874,134 A * 2/1999 Rao ........................ B01J 19/088 118/302
(Continued)

FOREIGN PATENT DOCUMENTS

WO WO 01/55454 A1 8/2001

OTHER PUBLICATIONS

Zeitschrift fur Physik 166, 406--428 (1962), Ans dem Physikalischen Institut der University Bonn "Effektive StoBquerschnitte bei Streuversuchen" Von K. Berkling, R. Helbing, K. Kramer, H. Pauly, Ch. Schlier und P. Toschek, Google translate for selected pages.*
(Continued)

*Primary Examiner* — Gordon R Baldwin
*Assistant Examiner* — Mohammad Mayy
(74) *Attorney, Agent, or Firm* — Alston & Bird LLP

(57) ABSTRACT

The present invention relates to a process for synthesizing a nanostructured composite material and to an implementation device associated with this process. The device (100) comprises a chamber (3) for synthesizing said material comprising a system (13, 13*a*, 13*b*) for depositing the matrix on a target surface (15); a system (1, 4, 5, 9) for generating a jet of nanoparticles in a carrier gas comprising an expansion chamber (1) equipped with an outlet orifice (7) for the nanoparticles toward the synthesis chamber (3, 3') and, in addition, means (21, 22, 23) for adjusting the distance L between the outlet orifice (7) of the expansion chamber and the target surface (15).

10 Claims, 3 Drawing Sheets

(51) Int. Cl.

| | |
|---|---|
| ***C23C 14/22*** | (2006.01) |
| ***C23C 14/54*** | (2006.01) |
| *B82Y 40/00* | (2011.01) |

(56) References Cited

U.S. PATENT DOCUMENTS

| | | | | |
|---|---|---|---|---|
| 6,313,015 | B1 * | 11/2001 | Lee et al. | 438/478 |
| 2003/0170383 | A1 * | 9/2003 | Eastham | B82Y 25/00 427/180 |
| 2004/0046130 | A1 * | 3/2004 | Rao et al. | 250/492.1 |
| 2010/0264016 | A1 * | 10/2010 | Anders | C23C 14/16 204/192.12 |

OTHER PUBLICATIONS

Partial Preliminary Search Report for Application No. FR 1257770 dated Jun. 13, 2013.

Berkling et al., *Effective Stoβquerschnitte bei Streuversuchen*, Zeitschrift für Physik 166 (1966) 406-428.

Cuvellier et al., *A Simple Method to Determine the Mean Cluster Size in a Molecular Beam*, Z. Phys. D—Atoms, Molecules and Clusters 21 (1991) 265-269.

Koylu et al., *Fractal and Projected Structure Properties of Soot Aggregates*, Combustion and Flame 100 (1995) 621-633.

Peng, D. L. et al., *Ferromagnetic, Transparent and Conducting ITO-Fe-Cluster Composite Films*, IEEE Transactions on Magnetics, vol. 41, No. 10, Oct. 2005, 3406-3408.

Wegner, K. et al., *Cluster Beam Deposition: A Tool for Nanoscale Science and Technology*, Journal of Physics D: Applied Physics, 39 (2006) R439-R459.

* cited by examiner

| $V_g/V_p$ | $Fao(\infty, \frac{V_g}{V_p})$ |
|---|---|
| 0,00 | ∞ |
| 0,05 | 22,586 |
| 0,10 | 11,321 |
| 0,15 | 7,5788 |
| 0,20 | 5,7168 |
| 0,25 | 4,6070 |
| 0,30 | 3,8731 |
| 0,35 | 3,3540 |
| 0,40 | 2,9690 |
| 0,45 | 2,6734 |
| 0,50 | 2,4403 |
| 0,55 | 2,2525 |
| 0,60 | 2,0986 |
| 0,65 | 1,9707 |
| 0,70 | 1,8632 |
| 0,75 | 1,7719 |
| 0,80 | 1,6937 |
| 0,85 | 1,6263 |
| 0,90 | 1,5677 |
| 0,95 | 1,5165 |
| 1,00 | 1,4716 |
| 1,10 | 1,3969 |
| 1,20 | 1,3378 |
| 1,30 | 1,2904 |
| 1,40 | 1,2520 |
| 1,50 | 1,2204 |
| 1,60 | 1.1943 |
| 1,70 | 1,1724 |
| 1,80 | 1,1540 |
| 1,90 | 1,1383 |
| 2,00 | 1,1249 |
| 2,10 | 1,1133 |
| 2,20 | 1,1033 |
| 2,30 | 1,0945 |
| 2,40 | 1,0868 |
| 2,50 | 1,0800 |
| 2,60 | 1,0740 |
| 2,70 | 1,0686 |
| 2,80 | 1,0638 |
| 2,90 | 1,0595 |
| 3,00 | 1,0556 |
| 3,20 | 1,0488 |
| 3,40 | 1,0433 |
| 3,60 | 1,0386 |
| 3,80 | 1,0346 |
| 4,00 | 1,0312 |
| 4,20 | 1,0283 |
| 4,40 | 1,0258 |
| 4,60 | 1,0236 |
| 4,80 | 1,0217 |
| 5,00 | 1,0200 |
| 5,20 | 1,0185 |
| 5,40 | 1,0171 |
| 5,60 | 1,0159 |
| 5,80 | 1,0149 |
| 6,00 | 1,0139 |
| 6,50 | 1,0118 |
| 7,00 | 1,0102 |
| 7,50 | 1,0089 |
| 8,00 | 1,0078 |
| 8,50 | 1,0069 |
| 9,00 | 1,0062 |
| 9,50 | 1,0055 |
| 10,00 | 1,0050 |
| ∞ | 1,0000 |

*Fig. 2*

METHOD FOR THE SYNTHESIS OF A NANOSTRUCTURED COMPOSITE MATERIAL AND A DEVICE FOR IMPLEMENTING SAID METHOD

FIELD

The present invention relates to the field of the synthesis of nanostructured composite materials.

BACKGROUND

These materials are formed by nanoparticles coated in a matrix.

The term "nanoparticles" is understood to mean particles, generally solid particles, the size of which is between 1 nm and a few hundred nanometers. For example, the size of the nanoparticles in question may be between 1 nm and 200 nm.

Nanostructured composite materials have properties that are radically different from those of the same material in the solid state, in particular as a function of the size of the nanoparticles coated in the matrix.

For example, it is generally necessary to provide nanoparticles with a size of less than 10 nm in order to modify the electronic and chemical properties of this material. According to another example, it is generally necessary to have nanoparticles with a size of less than 100 nm in order to modify the mechanical properties of the material (toughness, hardness, plasticity, etc.).

There are various techniques for forming such materials on a target surface.

One of these consists in coupling two different systems, one for depositing the nanoparticles on the target surface, the other for depositing the matrix on this target surface, in which matrix the nanoparticles are intended to be coated.

One device for synthesizing a nanostructured composite material belonging to this technique is proposed in the article "*Ferromagnetic, Transparent and Conducting ITO-Fe-Cluster Composite Films*", D. L. Peng & al., IEEE Transactions on Magnetics, vol. 41, no. 10, pp. 3406 to 3408, October 2005.

In this article, the device mainly comprises three regions: a first region formed by a sputtering chamber, a second region in which the nanoparticles grow and the size of which can be controlled and a third region formed by a deposition chamber in which the synthesis of the material is carried out.

The first two regions can be likened to a first system for the deposition of the nanoparticles on the target surface.

The third region is comparable to a second system for depositing the matrix, which is located in the synthesis chamber.

The coupling between the two systems is carried out by means of a skimmer through which the nanoparticles can enter into the synthesis chamber in order to be deposited on the target surface. This skimmer makes it possible to maintain a pressure differential between the two systems that it separates in order to facilitate the entry of the nanoparticles into the synthesis chamber.

The first system comprises means for generating a jet of carrier gas conveying the nanoparticles. Specifically, these means comprise a sputtering chamber for generating the nanoparticles and a source of carrier gas, such as argon.

The sputtering chamber in this case uses a plasma-gas-condensation (PGC) technique.

The sputtering chamber comprises an extension in which the nanoparticles thus generated can grow.

The first system also comprises an intermediate chamber, connected to the sputtering chamber by a skimmer. Once generated, the jet of carrier gas conveying the nanoparticles then exits the sputtering chamber, crosses the intermediate chamber and finally enters into the synthesis chamber, in order to enable the deposition of the nanoparticles on the target surface. The intermediate chamber thus comprises a skimmer at the inlet and a skimmer at the outlet, in order to maintain a high pressure differential between the sputtering chamber and the synthesis chamber.

For this purpose, the pressure in the intermediate chamber is lower than the pressure in the sputtering chamber. The pressure in the synthesis chamber is also lower than the pressure in the intermediate chamber.

For this reason, this device cannot use just any type of system for the deposition of the matrix. Indeed, this device must use sputter deposition with a special cathode of "Helicon" type, enabling operation at very low pressure. In this case, the pressure in the synthesis chamber is maintained at 0.013 Pa.

The device disclosed in this article has several limitations.

A first limitation is linked to the fact that the pressure must decrease from the sputtering chamber to the synthesis chamber so that the jet of carrier gas can convey the nanoparticles to the target surface located in the synthesis chamber.

This means that the pressure in the synthesis chamber is very low.

This very low pressure in the synthesis chamber is the cause of a second limitation. This is because the use of specific sputter deposition, of "Helicon" type, in order to be able to deposit the matrix at very low pressure in the synthesis chamber is obligatory.

A third limitation is linked to the source of nanoparticles, which functions via plasma gas condensation. Specifically, this technique is only possible for metallic nanoparticles. In this article, the nanoparticles are made of iron.

A fourth limitation is linked to the structure of the nanostructured composite material finally synthesized. Specifically, this article provides sequential structures where zones that contain nanoparticles and zones that do not contain any thereof follow one another. It is not therefore envisaged to synthesize nanostructured composite materials in which the nanoparticles are distributed homogeneously in the matrix.

SUMMARY

One objective of the invention is to overcome at least one of the limitations mentioned above.

In particular, one objective of the invention is to provide an increased choice of device for depositing the matrix that coats the nanoparticles.

In particular, another objective of the invention is to provide a process for synthesizing a nanostructured composite material, with which it is possible to synthesize a material for which the choice of the chemical nature of the nanoparticles and/or of the chemical nature of the matrix are increased.

Also in particular, one objective of the invention is again to provide a process for synthesizing a nanostructured composite material, with which it is conceivable to synthesize structures that are varied in the arrangement of the nanoparticles in the matrix, in particular more homogeneous structures.

The invention also aims to provide a device for implementing the process according to the invention.

In order to achieve at least one of these objectives, the invention provides a process for synthesizing a nanostructured composite material comprising nanoparticles coated in a matrix, characterized in that it comprises the following steps:

(a) depositing a matrix for said material in a chamber for synthesizing said material, on a target surface;

(b) generating a jet of nanoparticles in a carrier gas with a system comprising an expansion chamber equipped with an outlet orifice separating the expansion chamber from the synthesis chamber;

(c) adjusting the distance L between the outlet orifice of the expansion chamber and the target surface and/or adjusting the pressure of the gas present in the synthesis chamber.

The process could provide other technical features, taken alone or in combination:

- the pressure in the synthesis chamber is adjusted by introducing a supplementary gas into this synthesis chamber;
- the pressure in the synthesis chamber is adjusted by introducing an inert gas or a mixture of inert gases;
- one or more precursor gases are introduced into the synthesis chamber;
- the pressure in the expansion chamber is between 0.01 Pa and 10 Pa;
- the pressure in the synthesis chamber is between 0.001 Pa and 10 Pa, preferably between 0.1 Pa and 1 Pa;
- step (a) is carried out by sputtering, by physical vapor deposition or by chemical vapor deposition, optionally plasma-enhanced;
- the target surface is heated;
- the nanoparticles and the matrix are deposited on the target surface at the same time or sequentially;
- step (c) consists in adjusting said distance L and/or the pressure in the synthesis chamber so that the constant C defined by $$C = L \cdot N_g \cdot \frac{M_g}{n.M_p} \cdot \sigma \cdot F_{ao}\left(\infty, \frac{V_g}{V_p}\right)$$

has a value less than or equal to two, where:

- $N_g$ is the atomic or molecular density of the gas present in the synthesis chamber,
- $M_g$ is the molar mass of this gas,
- n is the mean number of atoms or molecules per nanoparticle,
- $M_p$ is the molar mass of said atoms or molecules making up the nanoparticles,
- σ is the mean geometric effective cross section of said nanoparticles, which are capable of being in an agglomerated or unagglomerated form, and $$F_{ao}\left(\infty, \frac{V_g}{V_p}\right)$$

is a factor that takes into account the influence of the mean velocity $V_g$ of the gas present in the synthesis chamber and the influence of the mean velocity $V_p$ of said nanoparticles in the jet of nanoparticles in a carrier gas, said factor being defined in the table of FIG. 2;

- step (c) consists in adjusting the constant C to a value less than or equal to 1.5.

For this purpose, the invention also provides a device for implementing the process according to the invention, characterized in that it comprises:

- a chamber for synthesizing said material comprising a system for depositing the matrix on a target surface;
- a system for generating a jet of nanoparticles in a carrier gas comprising an expansion chamber equipped with an outlet orifice for the nanoparticles, separating the expansion chamber from the synthesis chamber;
- means for adjusting the distance L between the outlet orifice of the expansion chamber and the target surface.

This device could provide other technical features, taken alone or in combination:

- the synthesis chamber comprises at least one device for introducing a gas, such as an inert gas, into this chamber;
- the system for generating a molecular jet of nanoparticles in a carrier gas also comprises:
  - a tank comprising a mixture of nanoparticles and a carrier gas;
  - a nozzle or an aerodynamic lens located between the tank and the expansion chamber;
  - a means for pumping the fluid present in the expansion chamber;
- the distance between the nozzle or the aerodynamic lens on the one hand, and the outlet orifice of the expansion chamber on the other hand, is between 1 mm and 60 mm, preferably between 5 mm and 30 mm;
- the distance between the nozzle or the aerodynamic lens on the one hand, and the outlet orifice of the expansion chamber on the other hand, is adjustable;
- the outlet orifice of the expansion chamber is a diaphragm intended to limit the solid angle of the jet of carrier gas conveying the nanoparticles, this diaphragm being for example a circular skimmer of conical cross section and the diameter of which, located at the tip of the cone, is between 0.1 mm and 2 mm.

BRIEF DESCRIPTION OF THE DRAWINGS

Other features, objectives and advantages of the invention will be mentioned in the detailed description below given with reference to the figures which represent, respectively:

FIG. 2 is a table representing the values of a factor that is dependent on the mean velocity $V_g$ of the atoms/molecules of the gas in the synthesis chamber over the mean velocity $V_p$ of the nanoparticles in the jet of carrier gas;

DETAILED DESCRIPTION

Figure 1:
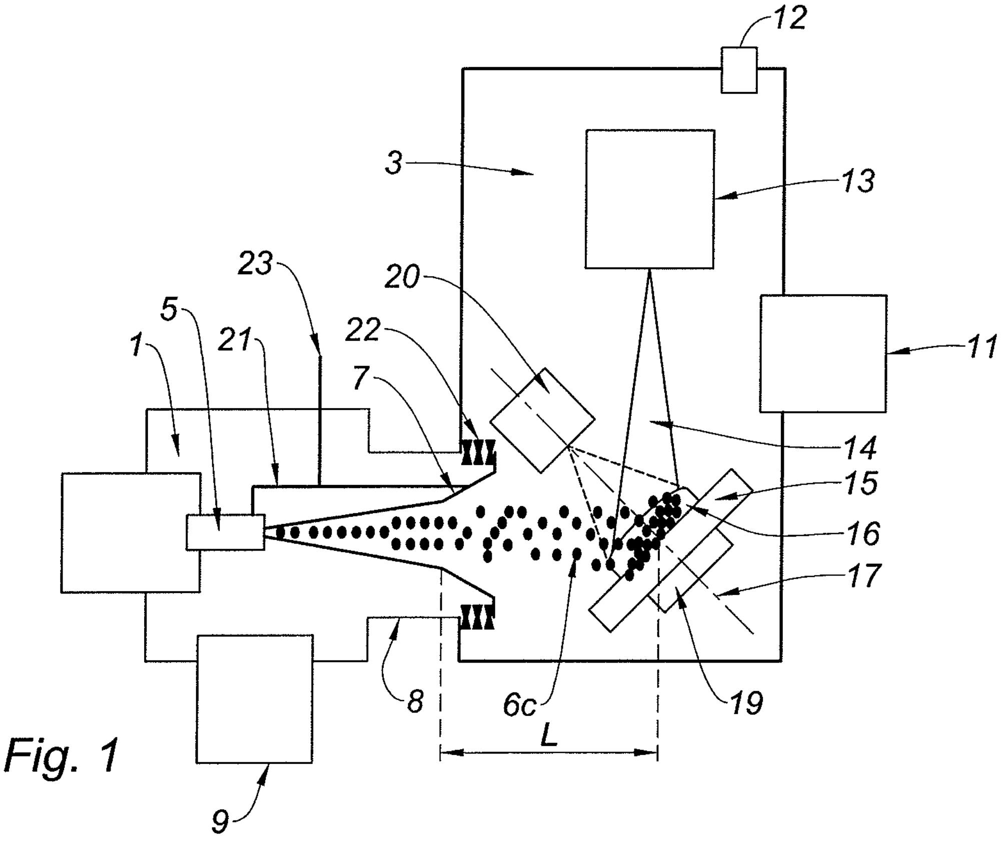
FIG. 1 is a diagram of a device for synthesizing a nanostructured composite material according to the invention.

The device 100 comprises a chamber 3 for synthesizing the nanostructured composite material. This nanostructured composite material is produced from nanoparticles coated in a matrix.

This synthesis chamber 3 comprises a system 13 for depositing the matrix on a target surface 15. This matrix deposition system 13 generates a flux of atoms or molecules 14 intended to be deposited on the target surface 15.

It also comprises a pumping means 11, for example produced with one or more turbomolecular pumps, making it possible to achieve a pressure between 0.001 Pa and 10 Pa in the synthesis chamber 3.

The synthesis chamber 3 also comprises a means 12, formed from one or more precision valves or one or more mass flowmeters, enabling the controlled entry into the synthesis chamber 3 of a supplementary gas.

This supplementary gas may be an inert gas such as argon, nitrogen or a mixture of inert gases in the case of physical vapor deposition (PVD). The deposition may be, for example, sputter deposition, arc plasma deposition, microwave plasma deposition or evaporation deposition. The introduction of this gas into the synthesis chamber 3 makes it possible to adjust the pressure in this chamber.

This supplementary gas may also be formed by one or more precursor gases in the case where the material of the matrix is deposited by chemical vapor deposition (CVD) or plasma-enhanced chemical vapor deposition (PECVD).

By using a quite conventional technique for depositing the matrix, such as sputtering, CVD or PECVD, the pressure in the synthesis chamber 3 must then be high enough to enable the operation of the deposition system 13.

For example, in the case of a conventional sputtering system 13, the minimum pressure to be achieved in the synthesis chamber is of the order of 0.1 Pa. The pressure in the synthesis chamber 3 is thus between 0.1 Pa and 10 Pa, advantageously between 0.1 Pa and 1 Pa. It should be noted that excessively high pressures in the synthesis chamber limit the size of the nanoparticles that can be deposited.

According to another example, the sputtering system is of high-power impulse magnetron sputtering (HiPIMS) type. In this case, the minimum pressure to be achieved in the synthesis chamber 3 is of the order of 0.05 Pa. The pressure in the synthesis chamber 3 is thus between 0.05 Pa and 10 Pa, advantageously between 0.05 Pa and 1 Pa. This technique makes it possible to significantly increase the deposition rates.

As can be observed, the device 100 may use deposition systems 13 capable of operating at pressures that may range up to 10 Pa. The latter pressure is considerably higher than the operating pressure in the synthesis chamber that uses sputtering with a "Helicon" type cathode in the article by D. L. Peng & al. Nevertheless, the device 100 can also operate at pressures comparable to the operating pressures necessary for the use of "Helicon" type sputtering.

This advantage may however be obtained under certain conditions that first require the complete description of the device 100.

The device 100 also comprises a system 1, 4, 5, 9 for generating a jet 6*a* of carrier gas conveying the nanoparticles.

The system 1, 4, 5, 9 comprises a tank 4 that contains a mixture of carrier gas and nanoparticles in gaseous suspension. The pressure and the temperature of the gas and also the concentration of nanoparticles in this gas are adjustable.

The tank 4 may be a synthesis reactor operating, for example, by laser pyrolysis, laser ablation, vacuum evaporation or combustion, or may be a plasma nanoparticle generator. It may also be a generator of nanometric aerosols formed from a suspension of nanoparticles in a liquid produced in advance or from a dry nanometric powder. These techniques do not have the limitations of the PGC technique as regards the materials that can be used for the nanoparticles.

This system 1, 4, 5, 9 also comprises an expansion chamber 1 into which the carrier gas containing the nanoparticles is introduced from the tank 4. The pressure in the expansion chamber 1 is less than the pressure of the tank 4.

The passage from the tank 4 to the expansion chamber 1 takes place via a means 5 that may be a nozzle or an aerodynamic lens.

In the case of a nozzle, it may be a Laval nozzle, a conical nozzle, a sonic nozzle or any other orifice. Its diameter may be between 0.1 mm and 2 mm. Its orifice may be of circular, oblong or rectangular shape.

In the case of an aerodynamic lens, its characteristics may be provided in order to obtain a convergent, collinear or divergent jet, as a function of its geometry, and of the pressures at its inlet and at its outlet, for a given equivalent aerodynamic diameter of nanoparticles transported by the carrier gas, and depending on the desired characteristics of the nanostructured material.

In the case of the device 100 represented in FIG. 1, the means 5 used is a divergent aerodynamic lens.

The system 1, 4, 5, 9 also comprises a pumping means 9, intended to establish a high vacuum in the expansion chamber 1. The pumping means 9 may be formed from one or more turbomolecular pumps or from a multi-stage roots pump.

A pressure between 0.01 Pa and 10 Pa is thus maintained in the expansion chamber 1. Preferably, this pressure is between 0.01 Pa and 0.2 Pa in order to facilitate the generation of a supersonic jet without having an excessively high pressure in the tank 4.

Within the context of the invention, the coupling between the system for generating the jet 6*a* of carrier gas conveying the nanoparticles and the chamber 3 for synthesizing the nanostructured composite material is achieved by means of an orifice 7 separating the expansion chamber 1 from the synthesis chamber 3. There is therefore no intermediate or buffer chamber as in the prior art, as is furthermore visible in the appended FIGS. 1 and 3.

The jet 6*a* of carrier gas containing the nanoparticles is thus generated between the tank 4 and the expansion chamber 1 with the aid of a pressure differential deliberately maintained between the tank 4 and the expansion chamber 1.

It then passes through the outlet orifice 7 of the expansion chamber 1.

Advantageously, this outlet orifice 7 is a diaphragm that has a dual role of separating the expansion chamber 1 and synthesis chamber 3 and of limiting the solid angle of the jet.

Such a diaphragm 7 may be circular or rectangular. It may be of flat or conical cross section.

Advantageously, the diaphragm 7 is a skimmer. This skimmer may be circular with a conical cross section, the diameter of which located at the tip of the cone is between 0.1 mm and 2 mm.

The minimum distance between the nozzle or the aerodynamic lens 5 and the outlet orifice 7 of the deposition chamber 1 may be between 1 mm and 60 mm. It is preferably chosen between 5 mm and 30 mm. It may be rendered externally adjustable, as a function of the expansion conditions of the jet, by manual or motorized adjustment means 21, 22, 23 which are described subsequently.

It should be noted that the jet of carrier gas conveying the nanoparticles that is propagated in the expansion chamber 1 may be a supersonic jet in the process of being formed or else an effusive jet.

On entering into a synthesis chamber where a high pressure prevails, such as those pressures presented previously for the synthesis chamber 3 in accordance with the invention, the data known to date indicated that the jet was degraded after its entry into the synthesis chamber so much so that neither the carrier gas nor the nanoparticles conveyed by this gas could reach the target surface 15.

It is furthermore for this reason that the device of Peng & al. operates at low pressure (0.013 Pa in this case) with a matrix deposition system of "Helicon" type. By this means, the jet of carrier gas can reach the target surface with the nanoparticles without being degraded.

Within the context of the invention, the inventors have on the other hand noticed that, under certain conditions, the nanoparticles continued their path in the direction of the target surface 15 despite, on the one hand, the degradation of the jet of carrier gas on entering the synthesis chamber and, on the other hand, a high pressure level (pressure between 0.05 Pa and 10 Pa) in this synthesis chamber 3.

The pressure in the synthesis chamber 3 may thus be high and therefore greater or even considerably greater than the pressure in the expansion chamber 1, when a conventional deposition system 13 is used. Nevertheless, the invention does not prohibit the pressure in the synthesis chamber 3 from being lower than the pressure in the intermediate chamber with other matrix deposition devices 13.

The conditions under which the invention enables an increased choice of devices for depositing the matrix that coats the nanoparticles will now be specified.

Indeed, the inventors have been able to demonstrate the influence of various physical parameters that make it possible to obtain a good quality deposition on the target surface 15.

These parameters are the following.

L (m): mean distance between the outlet orifice 7 and the target surface 15;

$N_g$ ($m^{-3}$): atomic/molecular density of the gas present in the synthesis chamber for the deposition of the matrix;

$M_g$ ($g \cdot mol^{-1}$): the molar mass of the gas present in the synthesis chamber for the deposition of the matrix;

n (dimensionless): the mean number of atoms/molecules per nanoparticle or per agglomerate of nanoparticles;

$M_p$ ($g \cdot mol^{-1}$): the molar mass of atoms/molecules making up the nanoparticles;

σ ($m^2$): the mean geometric effective cross section of a nanoparticle ($\sigma_p$) or of the agglomerate of nanoparticles ($\sigma_a$); and $F_{ao}(\infty, V_g/V_p)$ (dimensionless): a factor that is dependent on the (dimensionless) ratio between the mean velocity $V_g$ of the atoms/molecules present in the synthesis chamber over the mean velocity $V_p$ of the nanoparticles conveyed in the jet of carrier gas.

The distance L is specified in the appended figures. It is the distance traveled by the jet of nanoparticles in the synthesis chamber 3.

This distance L is advantageously adjustable.

For this purpose, a screw system 21 mounted on a runner in order to modify the distance between the means 5 and the outlet orifice 7 of the expansion chamber 1 may be provided. A bellows 22, positioned at the interface between the chambers 1 and 3, makes this variation in distance possible, while maintaining airtightness between these two chambers 1, 3. By this means, the distance between the means 5 and the target surface 15 is kept constant, so much so that the adjustment of the distance between the means 5 and the outlet orifice of the expansion chamber 1 also makes it possible to adjust the distance between this outlet orifice 7 and the target surface 15. Preferably, a mechanical system 23 external to the synthesis device 100 is used to act on the screw system and runner 21.

This adjustment system 21, 22, 23 is very widespread in the technical field in question. It has however been used to date in order to adjust the expansion conditions of the jet in the expansion chamber 1, when a buffer chamber is provided between the expansion chamber and the synthesis chamber.

According to one variant of this adjustment system (not represented), it is conceivable to insert spacers between the outlet orifice 7 of the expansion chamber 1 and the synthesis chamber 3 in order to adjust the distance L between this orifice 7 and the target surface 15. In this case, it is conceivable to keep the distance between the means 5 and the outlet orifice 7 of the expansion chamber 1 constant.

The gas present in the synthesis chamber 3 is advantageously introduced by the device 12. The nature of the gas in the synthesis chamber being known, its molar mass $M_g$ is easily deduced.

Furthermore, the density $N_g$ of this gas in the synthesis chamber 3 can be easily determined, for example by means of measuring the pressure in the synthesis chamber (not represented).

In the absence of an agglomerate, the mean number, $n=n_p$, of atoms/molecules per nanoparticle is for example determined by calculation. Indeed, by knowing the density of the material $d_p$ making up the nanoparticles, the molar mass $M_p$ and the radius $r_p$, the number $n_p$ can be deduced from the following relationship:

$$n_p = \frac{4}{3}\pi r_p^3 \cdot d_p \cdot \frac{N_A}{M_p} \quad \text{(R1)}$$

where:

$r_p$ is the mean radius of the nanoparticle in question (m);

$d_p$ is the density of the atoms/molecules making up the nanoparticles ($g \cdot m^{-3}$);

$M_p$ is the molar mass of the atoms/molecules making up the nanoparticles ($g \cdot mol^{-1}$); and $N_A$ is Avogadro's number ($mol^{-1}$).

In order to determine the mean radius $r_p$ of the nanoparticle, use is generally made of transmission electron microscopy (TEM). In a known manner, TEM makes it possible to take images over about a hundred nanoparticles. Statistical analysis of the images then makes it possible to determine the mean radius of a nanoparticle ($r_p$). Furthermore, the resolution obtained with this technique is of the order of a tenth of a nanometer.

Another method for determining the value of $r_p$, especially used when the nanoparticles are in suspension in a solvent, is dynamic light scattering (DLS). However, insofar as this method does not make it possible to determine whether the nanoparticles are in an agglomerated state or not, it is generally advisable to also carry out a measurement via TEM.

The nature of the nanoparticles being known, the molar mass $M_p$ of the atoms/molecules constituting the nanoparticles, and also their density $d_p$, is easily deduced.

One very widespread method for determining whether the nanoparticles are agglomerated or not is also TEM, via statistical analysis of the images.

This therefore makes it possible to know whether it is advisable to take into account the parameter $\sigma_p$ or $\sigma_a$ and what it is advisable to take into account for the parameter n.

In the absence of agglomeration, the mean geometric effective cross section of a nanoparticle ($\sigma_p$; no agglomeration) is given by:

$$\sigma=\sigma_p=\pi\cdot r_p^2 \quad \text{(R2)}$$

where: $r_p$ is the mean radius of the nanoparticle in question.

And the parameter $n=n_p$, as specified in the relationship (R1), for example.

In the case of agglomerated nanoparticles, then $$\sigma=\sigma_a$$

where $$\sigma_a = \frac{n_{pp}^{\frac{1}{\alpha}}}{k_a}\cdot\sigma_p. \quad \text{(R3)}$$

For the application of this relationship R3, the amount $\sigma_p$ has already been defined previously.

Furthermore, the coefficient $k_a$ is equal to 1.16 and the coefficient $\alpha$ is equal to 1.1.

The number $n_{pp}$ of nanoparticles in the agglomerate is generally determined by TEM, even though other techniques known to a person skilled in the art may be envisaged.

The knowledge of the number $n_{pp}$ furthermore makes it possible to obtain the number n, the mean number of atoms/molecules per agglomerate of nanoparticles, since $n=n_{pp}*n_p$ where $n_p$ is obtained by the relationship (R1). The article by Koliu & al., "*Fractal and Projected Structure Properties of Soot Aggregates*", Combustion and Flame 100: 621-633 (1995), details the elements that lead to the relationship between $\sigma_a$ and $\sigma_p$. In particular, it should be noted that images of agglomerates obtained by TEM are provided in this article.

Finally, the factor $F_{ao}(\infty, V_g/V_p)$ is determined from data provided in the article by Berkling & al., "Effektive Stoβquerschnitte bei Streuversuchen", Zeitschrift für Physik, 166, pp. 406-428 (1966).

In particular, this article provides a table that mentions the value of this factor as a function of the ratio $V_g/V_p$.

This table is reproduced in the appended FIG. 2.

There are several techniques for determining the mean velocity $V_p$ of the nanoparticles in the jet of carrier gas.

For example, it is possible to use the time-of-flight mass spectrometry method.

According to another example, it is possible to use the slotted chopper method, coupled to mass spectrometry.

According to another example, it is also possible to use optical methods of light scattering in the path of the nanoparticles. The time measured between two scatterings makes it possible to deduce the velocity therefrom. It should however be noted that the latter method is only applicable to nanoparticles that are large enough (typically at least 80 nm).

The mean velocity $V_g$ of the atoms/molecules forming the gas present in the synthesis chamber is determined by the laws of the kinetic theory of gases, namely:

$$\frac{1}{2}\cdot m_g\cdot V_g^2 = \frac{3}{2}\cdot k\cdot T \quad \text{(R4)}$$

where:

$m_g$ is the mass of an atom or of a molecule of the gas present in the synthesis chamber (kg)

k is the Boltzmann constant ($J\cdot kg^{-1}$); and

T is the absolute temperature of the gas present in the synthesis chamber (K).

Besides the parameters identified by the inventors, the latter have noticed that these parameters had to comply with a particular relationship in order to obtain a good quality deposition on the target surface.

Specifically, the inventors have defined a (dimensionless) constant C by the relationship:

$$C = L\cdot N_g\cdot\frac{M_g}{n.M_p}\cdot\sigma\cdot F_{ao}\left(\infty, \frac{V_g}{V_p}\right) \quad \text{(R5)}$$

for which C must be less than or equal to a maximum value $C_{max}=2$.

It should be noted that the parameters L, $N_g$, $M_g$, n, $M_p$, $\sigma$ and $F_{ao}(\infty, V_g/V_p)$ that define the constant C have already been identified as being involved in the relative velocity variation $\Delta V/V$ of a cluster of argon atoms between the inlet and the outlet of a pressurized chamber, referred to hereinbelow as final chamber, having a length L between its inlet and its outlet.

Reference may for example be made to the article by Cuvellier & al., "*A simple method to determine the mean cluster size in a molecular beam*", Z. Phys. D—Atoms, Molecules and Clusters 21, 265-269 (1991).

These parameters are therefore representative of a physical reality linked in particular to the variation of velocity of the nanoparticles in a chamber in which a given pressure is maintained.

More specifically, by comparing the relationship (R5) with the relationship (6) provided in the article by Cuvellier & al. (1991), it is noted that it is the constant C which is uniform (although different) at a relative velocity variation as defined in this article.

In this article, a system is provided for generating nanoparticles (or clusters) from a gas by expansion in a supersonic jet. These particles are conveyed by the non-clustered part of the atoms (argon in this case) of gas which becomes a carrier gas. A skimmer separates the expansion chamber from an intermediate chamber. The final formation of the supersonic beam of gas takes place after the passage of the skimmer into this intermediate chamber owing to a pressure differential maintained between the expansion chamber and the intermediate chamber. The pressure in the intermediate chamber is at least a factor of 10 lower than in the buffer chamber. This is the condition necessary for establishing a quality supersonic gas jet. A final chamber, connected to the intermediate chamber and maintained at an adjustable pressure, is passed through by the supersonic jet conveying the nanoparticles. The outlet of this final chamber is equipped with means for determining the velocity of the nanoparticles.

The device proposed in this article aims simply to determine the mean size of argon clusters using a measurement of the variation of their velocity at the outlet of the final chamber. It is not therefore interested in the synthesis of a nanostructured composite material comprising nanoparticles coated in a matrix.

Furthermore, the formation of the supersonic jet is carried out in a conventional manner, namely with an intermediate chamber, contrary to what is proposed in the invention.

Finally, the pressures in the final chamber are very low, a priori in order to ensure a pressure gradient between the generation of the jet and the final chamber (as in Peng & al.), hence pressures that do not exceed $3\times10^{-4}$ mbar (cf. FIG. 2 of this article), namely around 0.03 Pa, in this final chamber. At these pressure levels, it would be impossible to use a system 13 for the deposition of a matrix by sputtering (conventional sputtering=0.1 Pa minimum; HiPIMS=0.05 Pa minimum), as is proposed within the context of the invention.

One advantage of the constant C lies in the fact that it makes it possible to define an easily identifiable limit $C_{max}$ above which the deposition is no longer of good quality. Thus, beyond this value $C_{max}$, a good quality deposition on the target surface 15 is not guaranteed.

The constant C could especially be less than or equal to 1.9; 1.8; 1.7; 1.6; or preferably less than or equal to 1.5, below which value the deposition is of excellent quality. More generally, it is particularly advantageous to define a constant C that is as low as possible (the value zero being, by definition, excluded, since it physically results in an absence of operation of the synthesis device).

The device 100 according to the invention therefore provides different deposition systems on one and the same target surface 15. A first deposition system makes it possible to deposit nanoparticles on the target surface, the other making it possible to deposit the matrix in which the nanoparticles will be coated in order to form the nanostructured composite material 16.

The chemical natures of the nanoparticles on the one hand and of the matrix on the other hand may be chosen independently of one another. The device 100 thus offers a great flexibility in the choice of the materials that can be used for the nanoparticles on the one hand and the matrix on the other hand. This is mainly linked to the fact that the generation of the jet of carrier gas conveying the nanoparticles and the deposition of the matrix in the synthesis chamber are independent of one another.

The synthesis chamber 3 may use conventional deposition techniques that facilitate the deposition of all types of materials for the matrix, techniques such as sputtering, PVD or PECVD, in particular low-pressure PECVD. The expression “low-pressure PECVD” should be understood here to mean that the pressures envisaged are typically between 0.1 Pa and 1 Pa, PECVD techniques generally being able to be used up to pressures of 1000 Pa.

The target surface 15 may be driven by a rotational movement by manual or motorized displacement means 19.

These means 19 may permit translational and rotational movements of the target surface 15 along all axes and in all directions.

This makes it possible to obtain deliberately inhomogeneous depositions. For example, it is possible, over certain zones of the target surface 15, to form patterns having a higher density of nanoparticles.

The inhomogeneity of the deposition of nanoparticles may also be facilitated by the choice of the jet, slightly divergent, collinear or convergent depending on the case. The shape of this jet may for example be determined by the choice of the aerodynamic lens 5.

These means more simply enable a rotational displacement of the target surface 15 about its main axis 17.

This enables more homogeneous depositions.

Furthermore, the freedom of positioning of the target surface offered by the means 19, which may be positioned on the face of said target surface 15 opposite the face on which the deposition is carried out, makes it possible to produce a co-deposition of the nanoparticles with the matrix or, on the contrary, a sequential deposition of the nanoparticles and of the matrix.

For example, the configuration represented in FIG. 1 enables a co-deposition of the matrix and of the nanoparticles that is said to be angular.

According to this angular configuration, the axis 17 normal to the target surface 15 is placed between the axis of propagation of the jet of nanoparticles and the axis of propagation of the beam 14 of atoms or molecules generated by the matrix deposition system 13.

In the particular configuration presented in FIG. 1, the angle between the axis of the beam 14 and the axis of propagation of the jet 6*c* of nanoparticles is 90° and the axis 17 normal to the target surface 15 forms an angle of 45° with respect to each of these axes. This enables the co-deposition of the matrix and of the nanoparticles.

It is also possible to carry out a sequential deposition with the device represented in FIG. 1. For example, in order to carry out a sequential deposition of the matrix and of the nanoparticles, it is possible to position the axis 17 normal to the target surface 15, with the displacement means 19 for this target surface 15, sequentially, parallel to the axis of the beam 14 or to the axis of the jet 6*c* of nanoparticles.

A sequential deposition makes it possible, for example, to produce patterns having a high density of nanoparticles in two or three dimensions on the target surface 15. A sequential deposition also makes it possible to produce multilayer depositions composed of various materials, in particular as regards the nature of the nanoparticles.

The synthesis chamber 3 may also comprise a heating means 20, advantageously positioned opposite the face of the target surface 15 on which the synthesis of the nanostructured composite material is carried out.

By bringing the target surface 15 to temperatures higher than ambient temperature, it is then possible to control the porosity and the structure, at the micrometer and nanometer scales, of the nanostructured composite material finally obtained.

The heating means 20 for heating the target surface 15 may operate by conduction. In this case, the heating means 20, for example an electric resistance heater, is positioned on the rear face of the substrate 15, this rear face being the face of the substrate 15 opposite the face on which the deposition is carried out.

As a variant, the heating means 20 may operate by electromagnetic radiation or by electron bombardment, as is represented in FIG. 1.

In the case of heating by electromagnetic radiation, the heating means 20 may be a pulsed or continuous laser, a lamp optionally equipped with a spectral filtration and/or focusing device, or any other source of electromagnetic radiation.

An example of deposition of a material carried out with the device from FIG. 1 (aerodynamic lens) is provided below:

$N_g$=2.42E+19 $m^{-3}$ (which corresponds to a pressure of 0.1 Pa in the synthesis chamber 3);
$M_g$=6.64E−23 $g\cdot mol^{-1}$ (argon);
$n=n_g$=3266;
$M_p$=4.66E−23 $g\cdot mol^{-1}$ (silicon);
$r_p$=2.5 mm, i.e. $\sigma_p$=7.85E−17 $m^2$ (no agglomerate);
$V_g/V_p$=0.916 which gives $$F_{\alpha o}\left(\infty, \frac{V_g}{V_p}\right) = 1.55$$

from the table of FIG. 2; and

L=0.2 m, which gives a value of 0.3 approximately for the constant C.

The preceding example results from a test carried out for non-agglomerated nanoparticles.

Figure 4:
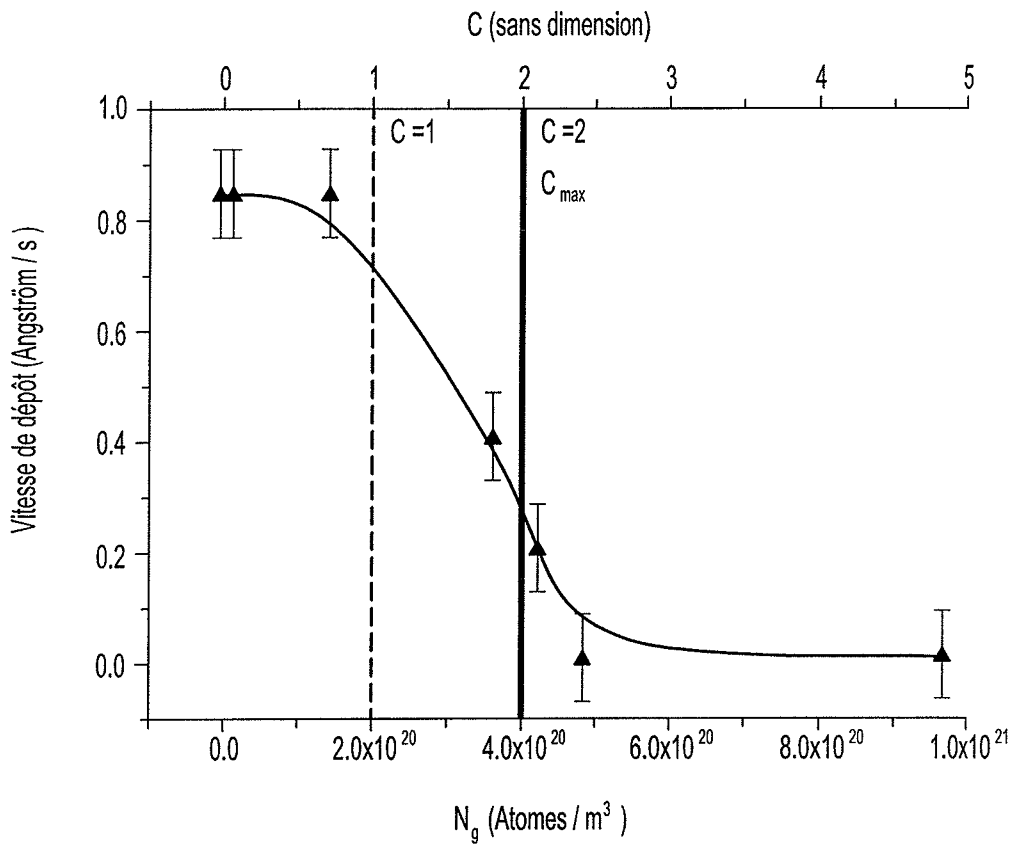
FIG. 4 represents the change in the rate of deposition of nanoparticles on a target surface, with the device represented in FIG. 1, as a function of the atomic or molecular density of the gas present in the synthesis chamber, therefore as a function of the pressure.

Other experimental examples carried out with the device from FIG. 1 are provided in support of FIG. 4, for agglomerated nanoparticles, under the following conditions:

$N_g$ variable since several tests are presented in FIG. 4 ($N_g$ is representative of the pressure in the synthesis chamber 3);

$M_g$=6.64E−23 g·mol$^{-1}$ (argon);

$n_{pp}$=250 (TEM measurement);

n=$n_{pp}$*$n_p$=250*3266=816 500

$M_p$=4.66E−23 g·mol$^{-1}$ (silicon)

$r_p$=2.5 mm, i.e. $\sigma_p$=7.85E−17 m$^2$ then $\sigma_a$=1.02E−14 m$^2$ (since agglomerate);

$V_g/V_p$=1.2875 which gives $$F_{ao}\left(\infty, \frac{V_g}{V_p}\right) = 1.35$$

from the table of FIG. 2; and

L=0.2 m.

FIG. 4 represents 7 tests which were carried out under the preceding conditions, for various pressure values in the synthesis chamber ($N_g$; as x-axis). As y-axis, the deposition rate of the nanoparticles on the target surface 15 is given. Furthermore, to aid the interpretation, the expression of the constant C is also provided as x-axis, this constant being directly proportional to the value of $N_g$.

It should be noted that the variable $N_g$ could entirely be replaced by the length L, considering the expression of the constant C.

A good quality deposition can be obtained up to C=$C_{max}$=2; which corresponds, in this specific case, to an argon pressure of around 1.65 Pa.

Figure 3:
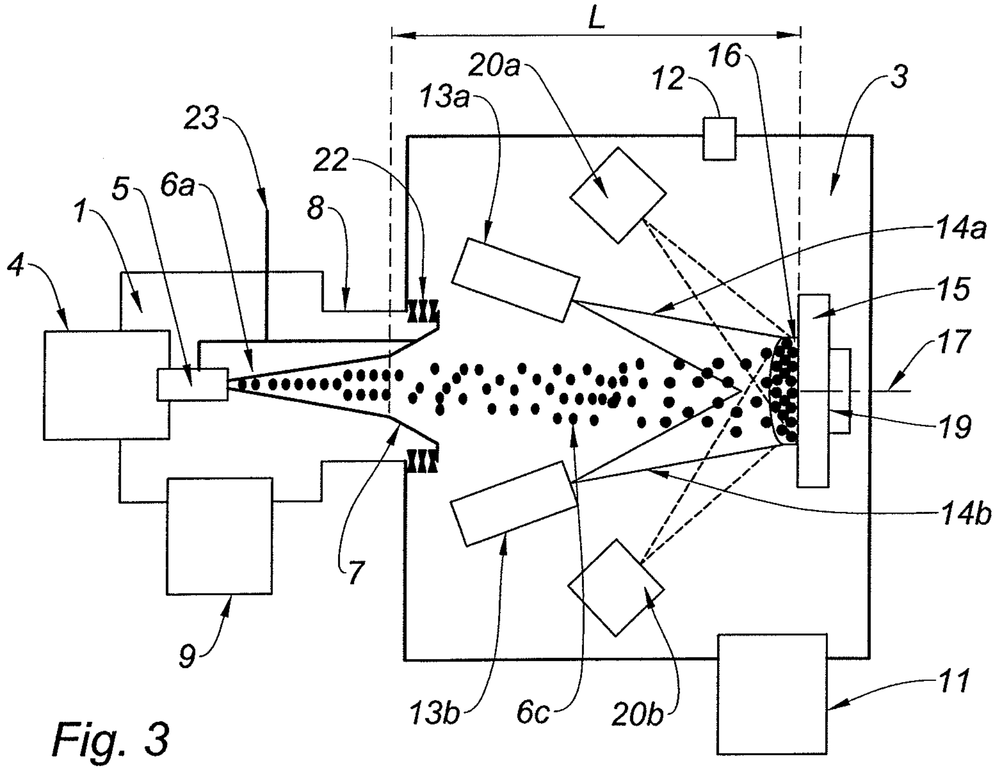
FIG. 3 is a diagram of an embodiment variant of the device represented in FIG. 1.

One embodiment variant 100' of the device 100 from FIG. 1 is represented in FIG. 3.

The device 100' differs from the device 100 by the content alone of the synthesis chamber 3'.

Indeed, the system 4, 1, 5, 9 for generating the jet of nanoparticles in a carrier gas is not modified. The description given previously therefore also applies to the device 100'.

In this variant, the configuration of the synthesis chamber 3' is produced in order to carry out a concentric deposition, which may be a co-deposition or a sequential deposition of the matrix and of the nanoparticles.

In this configuration, the axis 17 normal to the target surface 15 is merged with the axis of propagation of the jet of nanoparticles 6*c*.

This configuration may include one or more deposition systems 13*a*, 13*b*, which may be identical.

One particular version of this configuration comprises two matrix deposition devices 13*a*, 13*b*.

As represented in FIG. 3, the axes of propagation of the atoms or molecules 14*a*, 14*b* generated by these deposition systems 13*a*, 13*b* are placed at angles between 0° and 90° with respect to the axis of propagation of the jet of nanoparticles 6*c*.

This embodiment variant is beneficial when it is desired to increase the rate of synthesis of the nanostructured composite material. It also makes it possible to deposit several materials of different chemical natures for the matrix, at the same time or sequentially.

As a variant (not represented), one or more deposition systems of annular geometry and that are pierced at their centers in order to allow the supersonic jet of nanoparticles to pass through could also be included. This variant may be particularly advantageous from an industrial standpoint, since it makes it possible to increase the rate of synthesis of the nanostructured composite material even further, by increasing the rate of deposition of the matrix.

The representation of FIG. 3 shows the device in operation, during a co-deposition of the matrix and of the nanoparticles on the target surface 15. The means 5 used is in this case a divergent aerodynamic lens.

A sequential deposition could be envisaged by sequentially operating the matrix deposition systems 13*a*, 13*b* on the one hand and the system for generating the supersonic jet of nanoparticles on the other hand.

The simple or reactive, sequential or simultaneous deposition of several materials constituting the matrix makes it possible to obtain complex chemical profiles of the matrix depending on the thickness of the layer deposited on the target surface 15.

In particular, it is then possible to synthesize a nanostructured composite material with a matrix having a variable chemical composition as a function of the thickness. One advantageous application would relate to the manufacture of nanostructured junctions in the microelectronics field, for example p-n junctions for diodes, transistors or photovoltaic cells based on silicon.

With the devices 100, 100' described above, it is then possible to implement a process for synthesizing a nanostructured composite material 16 comprising nanoparticles coated in a matrix comprising the following steps:

(a) depositing a matrix for said material in a chamber 3, 3' for synthesizing said material, on a target surface 15;

(b) generating a jet of nanoparticles in a carrier gas with a system 1, 4, 9, 5 comprising an expansion chamber 1 equipped with an outlet orifice 7 separating the expansion chamber from the synthesis chamber 3, 3';

(c) adjusting the distance L between the outlet orifice 7 of the expansion chamber 1 and the target surface 15 and/or adjusting the pressure of the gas present in the synthesis chamber.

Step (a) can be carried out by conventional sputtering, by physical vapor deposition or by chemical vapor deposition, optionally plasma-enhanced. In particular, it is possible to use low-pressure plasma-enhanced chemical vapor deposition as defined above.

It is possible to heat the target surface 15 in order to control the porosity and the structure, at the micrometer and nanometer scales, of the nanostructured composite material finally obtained.

Finally, and as mentioned previously, the nanoparticles and the matrix could be deposited on the target surface 15 at the same time or, on the contrary, sequentially.

The distance L and/or the pressure are adjusted so that C is less than or equal to two, where the parameters that occur in the constant C have been defined previously.

The value of the constant C could be adjusted in order to be less than or equal to 1.9; 1.8; 1.7; 1.6; or preferably less than or equal to 1.5, below which value the deposition is of excellent quality.

Typically, the pressure in the expansion chamber 1 is between 0.01 Pa and 10 Pa, preferably between 0.01 Pa and 0.2 Pa and the pressure in the synthesis chamber 3, 3' is between 0.001 Pa and 10 Pa.

In particular, the pressure in the expansion chamber 1 is advantageously between 0.01 Pa and 0.2 Pa, for reasons already mentioned previously. Also in particular, the pressure in the synthesis chamber 3 could be between 0.05 Pa and 10 Pa, advantageously between 0.1 Pa and 1 Pa. This makes it possible to use a conventional deposition system, chosen from one of those described previously.

In practice, a good quality deposition can be obtained in various ways. It is possible to adjust the distance L between the outlet orifice 7 of the expansion chamber 1, 1' and the synthesis chamber 3, 3'.

It is also possible to adjust the pressure in the synthesis chamber 3, 3' (and therefore the quantity $N_g$) by introduction of an inert gas such as argon, nitrogen or a mixture of inert gases.

It is further possible to introduce one or more precursor gases in the case where the deposition of the material of the matrix is carried out by chemical vapor deposition, optionally plasma-enhanced chemical vapor deposition (PECVD), or by conventional sputtering.

The temperature of the synthesis chamber 3, 3' could also be adjusted in order to adjust the pressure therein.

The solutions that consist in adjusting the distance L between the outlet orifice 7 of the expansion chamber 1, 1' and the synthesis chamber 3, 3' and/or in introducing a supplementary gas into this chamber 3, 3' are however the easiest solutions to implement.

Indeed, the devices 100, 100' represented in FIGS. 1 and 3 use a system for adjusting the distance L (for example the system 21, 22, 23), and also a means 12 for introducing a supplementary gas into the synthesis chamber which are easy to implement.

More generally, the invention relates to a process for synthesizing a nanostructured composite material 16 comprising nanoparticles coated in a matrix, comprising the following steps:

(A) depositing a matrix for said material in a chamber 3, 3' for synthesizing said material, on a target surface 15;

(B) generating a jet of nanoparticles in a carrier gas with a system 1, 4, 9, 5 comprising an expansion chamber 1 equipped with an outlet orifice 7 separating the expansion chamber 1 from the synthesis chamber 3, 3';

(C) adjusting the constant C defined by $$C = L \cdot N_g \cdot \frac{M_g}{n \cdot M_p} \cdot \sigma \cdot F_{ao}\left(\infty, \frac{V_g}{V_p}\right)$$

to a value less than or equal to two, where the various parameters that occur in the expression of this constant C have been defined previously.

In the latter process (steps (A), (B) and (C)), the distance L will advantageously be adjusted and/or the pressure in the synthesis chamber 3, 3' will be adjusted in order to adjust the constant C as described previously.

However, the value of the constant C could be adjusted by adjusting the temperature of the synthesis chamber 3, 3'.

The factor $$F_{ao}\left(\infty, \frac{V_g}{V_p}\right)$$

could be influenced. This may, for example, be carried out by modifying the temperature of the gas conveying the nanoparticles before the expansion in order to act on the velocity of the particles $V_p$ by means of the velocity of the carrier gas.

The device according to the invention is particularly promising. Specifically, the economic context which motivates the production of novel nanostructured composite materials is extremely broad. This is linked to the diversity of the materials that can be envisaged for the nanoparticles and the matrix. Thus, the field of application of the invention may be very extensive in its uses.

It may, for example, be the currently very high-growth field of energy production and storage, information storage, surface treatment for imparting novel (self-cleaning, self-healing, abrasion resistant, etc.) properties to supports.

In particular, one of the applications envisaged with the device 100, 100' according to the invention lies in the field of the conversion of solar radiation into electricity.

Current photovoltaic solar cells for the most part use crystalline silicon as the conversion material. The targeted application would consist of a high-efficiency all-silicon solar cell. For this, a tandem cell would be envisaged in which a junction made with a nanostructured composite material based on silicon crystals is juxtaposed with a conventional monocrystalline junction.

In order to limit the thermalization of the carriers generated by the energetic photons, the gap of the nanostructured composite material may be adjusted to a target value close to 1.7 eV as a function of the size of the nanoparticles, in this case nanocrystals. The theoretical efficiency of such a tandem cell has been determined as being close to 42%, which should be compared to the 24% efficiency of a conventional silicon cell, obtained in the laboratory. The junction made with a nanostructured composite material would be composed of controlled size crystalline silicon nanoparticles coated in an $SiO_2$, $Si_3N_4$ or SiC matrix.

Other applications using other materials for the nanoparticles and for the matrix, such as for example ceramics or diamond, are targeted in the fields of mechanical surface reinforcement by nanostructured depositions or self-repairing materials, for example.

The nanostructured composite materials having a metallic matrix are used in the motor vehicle (Al/SiC), microelectronics (Al/AlN or $Al_2O_3$), magnetism (Fe/MgO), catalysis (Fe/TiN), structural materials (ODS steel, Nb/Cu) and electrochemistry ($Ni/TiO_2$) industries.

The nanostructured composite materials having a ceramic matrix are encountered in the fields of catalysis ($TiO_2$/Pt), optical fibers ($SiO_2$/Co), structural materials ($Al_2O_3$ or $Si_3N_4$/SiC), luminescent materials ($Al_2O_3$/$NdAlO_3$) and magnetism ($TiO_2$/$Fe_2O_3$).

The invention claimed is:

1. Process for synthesizing a nanostructured composite material comprising nanoparticles coated in a matrix, said process comprising the following steps:

(a) depositing a matrix for said material in a synthesis chamber for synthesizing said material, on a target surface, said synthesis chamber comprising a gas which pressure is between 0.1 Pa and 10 Pa when a conventional sputtering technique is used for depositing said matrix, or which pressure is between 0.05 Pa and 10 Pa when a high-power impulse magnetron sputtering technique is used for depositing said matrix;

(b) generating a jet of nanoparticles in a carrier gas with a system comprising an expansion chamber, said expansion chamber comprising the gas and being equipped with an outlet orifice separating the expansion chamber from the synthesis chamber;

wherein the pressure of the gas present in the synthesis chamber is greater than the pressure of the gas present in the expansion chamber, and wherein said process further comprises the following step:

(c) adjusting a distance between the outlet orifice of the expansion chamber and the target surface and/or adjusting the pressure of the gas present in the synthesis chamber so that the constant C defined by $$C = L \cdot N_g \cdot \frac{M_g}{n \cdot M_p} \cdot \sigma \cdot F_{ao}\left(\infty, \frac{V_g}{V_p}\right)$$

has a value less than or equal to two, where:

L is the distance between the outlet orifice of the expansion chamber and the target surface $N_g$ is the atomic or molecular density of the gas present in the synthesis chamber, $M_g$ is the molar mass of this gas, n is the mean number of atoms or molecules per nanoparticle, $M_p$ is the molar mass of said atoms or molecules making up the nanoparticles, σ is the mean geometric effective cross section of said nanoparticles, which are capable of being in an agglomerated or unagglomerated form, and $$F_{ao}\left(\infty, \frac{V_g}{V_p}\right)$$

is a factor that takes into account the influence of the mean velocity $V_g$ of the gas present in the synthesis chamber and the influence of the mean velocity $V_p$ of said nanoparticles in the jet of nanoparticles in a carrier gas, said factor being defined in the table of FIG. 2.

2. Process according to claim 1, in which the pressure in the synthesis chamber is adjusted by introducing a supplementary gas into this synthesis chamber.

3. Process according to claim 1, in which the pressure in the synthesis chamber is adjusted by introducing an inert gas or a mixture of inert gases.

4. Process according to claim 1, in which one or more precursor gases are introduced into the synthesis chamber.

5. Process according to claim 1, in which the target surface is heated.

6. Process according to claim 1, in which the nanoparticles and the matrix are deposited on the target surface at the same time or sequentially.

7. Process according to claim 1, in which step (c) consists in adjusting the constant C to a value less than or equal to 1.5.

8. The process according to claim 1, further comprising the step of modifying the temperature of the carrier gas conveying the nanoparticles.

9. Process according to claim 1, in which the gas contained in the synthesis chamber has a pressure between 0.1 Pa and 1 Pa where said conventional sputtering technique is used for depositing said matrix.

10. Process according to claim 1, in which the gas contained in the synthesis chamber has a pressure between 0.05 Pa and 1 Pa where said high-power impulse magnetron sputtering technique is used for depositing said matrix.

* * * * *